United States Patent
Li

(10) Patent No.: US 10,879,164 B2
(45) Date of Patent: Dec. 29, 2020

(54) INTEGRATED CIRCUIT ELECTROSTATIC DISCHARGE BUS STRUCTURE AND RELATED METHOD

(71) Applicant: Yangtze Memory Technologies Co., Ltd., Wuhan (CN)

(72) Inventor: Zhiguo Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 30 days.

(21) Appl. No.: 16/207,183

(22) Filed: Dec. 2, 2018

(65) Prior Publication Data

US 2020/0144174 A1    May 7, 2020

Related U.S. Application Data

(63) Continuation of application No. PCT/CN2018/113271, filed on Nov. 1, 2018.

(51) Int. Cl.
| | |
|---|---|
| *H01L 23/52* | (2006.01) |
| *H01L 23/50* | (2006.01) |
| *H01L 23/49* | (2006.01) |
| *H01L 27/02* | (2006.01) |

(52) U.S. Cl.
CPC .............. *H01L 23/50* (2013.01); *H01L 23/49* (2013.01); *H01L 27/0248* (2013.01)

(58) Field of Classification Search
CPC ..... H01L 23/50; H01L 23/60; H01L 2924/14; H01L 24/06; H01L 27/0292; H01L 23/62
USPC .................. 257/691, 784; 438/106
See application file for complete search history.

(56) References Cited

U.S. PATENT DOCUMENTS

| | | | | |
|---|---|---|---|---|
| 5,347,150 | A | * | 9/1994 | Sakai ................... H01L 27/0218 257/203 |
| 5,365,091 | A | * | 11/1994 | Yamagishi ........ H01L 27/11898 257/203 |
| 6,078,068 | A | * | 6/2000 | Tamura ................... H01L 23/62 257/203 |
| 6,770,963 | B1 | | 8/2004 | Wu |
| 7,129,574 | B2 | * | 10/2006 | Wu .......................... H01L 23/50 257/691 |
| 7,692,247 | B2 | * | 4/2010 | Woo .................... H01F 17/0006 257/355 |
| 2014/0061881 | A1 | | 3/2014 | Yeh |

FOREIGN PATENT DOCUMENTS

| | | |
|---|---|---|
| CN | 101097304 A | 1/2008 |
| CN | 101221629 A | 7/2008 |
| CN | 102054523 A | 5/2011 |
| CN | 101097304 B | 7/2011 |
| CN | 103000625 A | 3/2013 |
| CN | 103681654 A | 3/2014 |
| KR | 20020034470 A | 5/2002 |
| TW | 201737459 A | 10/2017 |
| WO | 0028664 A3 | 7/2001 |

* cited by examiner

*Primary Examiner* — S. V. Clark
(74) *Attorney, Agent, or Firm* — Winston Hsu

(57) ABSTRACT

An integrated circuit ESD bus structure includes a circuit area; a plurality of electrostatic discharge (ESD) buses; a plurality of pad groups adjacent and connected to the plurality of ESD buses; a common ESD bus; and a plurality of bonding wires configured to connect the plurality of pad groups to the common ESD bus.

14 Claims, 3 Drawing Sheets

INTEGRATED CIRCUIT ELECTROSTATIC DISCHARGE BUS STRUCTURE AND RELATED METHOD

CROSS REFERENCE TO RELATED APPLICATIONS

This present application is a continuation application of International Application No. PCT/CN2018/113271 filed on Nov. 1, 2018, which is incorporated herein by reference in its entirety.

BACKGROUND OF THE INVENTION

1. Field of the Invention

The present invention relates to an integrated circuit structure and related method, and more particularly, to an integrated circuit electrostatic discharge bus structure and related method.

2. Description of the Prior Art

For an integrated circuit electrostatic discharge (hereinafter abbreviated ESD) structure 1 as shown in FIG. 1, I/O (input/output) pads 12 are placed around a circuit area 10 inside a plurality of chip edges 13 based on particular sequence and position, wherein the placement of the I/O pads 12 is adjustable within a specific range.

In general, it is commonly to place filler cells F1 and F2 at empty spaces between the I/O pads 12, and connect the filler cells F1 and F2 to an electrostatic discharge (ESD) bus 11 (e.g., a layout trace connected to a ground or a system voltage), which makes each portion of the circuit area 10 and the filler cells F1 and F2 are connected to the continuous ESD bus to provide ESD protection to the integrated circuit ESD bus structure 1.

However, the filler cells F1 and F2 take a portion of the circuit area 10 to be wasteful to the integrated circuit ESD bus structure 1. Further, under the strict requirement of the integrated circuit ESD bus structure 1 having a rectangular shape, it causes the lack of flexibility for internal circuit layout design.

Further, when there are circuits with irregular shapes and different areas, the circuit area 10 must be increased in order to contain the circuits with irregular shapes and different areas, which increases production cost.

Accordingly, it is desirable to provide an integrated circuit ESD bus structure and related method to make full use of the circuit area.

SUMMARY OF THE INVENTION

It is therefore an objective of the present invention to provide an integrated circuit electrostatic discharge bus structure and related method.

To achieve the above technical object, according to the present invention, an integrated circuit electrostatic discharge (ESD) structure is provided, and includes a circuit area; a plurality of electrostatic discharge buses; a plurality of pad groups adjacent and connected to the plurality of ESD buses; a common ESD bus; and a plurality of bonding wires configured to connect the plurality of pad groups to the common ESD bus.

To achieve the above technical object, according to the present invention, an integrated circuit electrostatic discharge (ESD) structure is provided, and includes a circuit area; a plurality of electrostatic discharge (ESD) buses; a plurality of pad groups; and a plurality of bonding wires configured to connect one to another of the plurality of pad groups.

To achieve the above technical object, according to the present invention, a method of integrated circuit ESD bus structure is provided, and includes forming a circuit area; forming a plurality of pad groups corresponding to a plurality of discontinuous boundaries of the circuit area; forming a common ESD bus; and connecting a plurality of pads corresponding to the plurality of pad groups to the common ESD bus by a plurality of bonding wires across one of the plurality of chip edges.

To achieve the above technical object, according to the present invention, a method of integrated circuit ESD bus structure is provided, and includes forming a circuit area, forming a plurality of pad groups corresponding to a plurality of discontinuous boundaries of the circuit area; and connecting one of the plurality of pad groups to another of the plurality of pad groups by one of a plurality of bonding wires across the circuit area.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
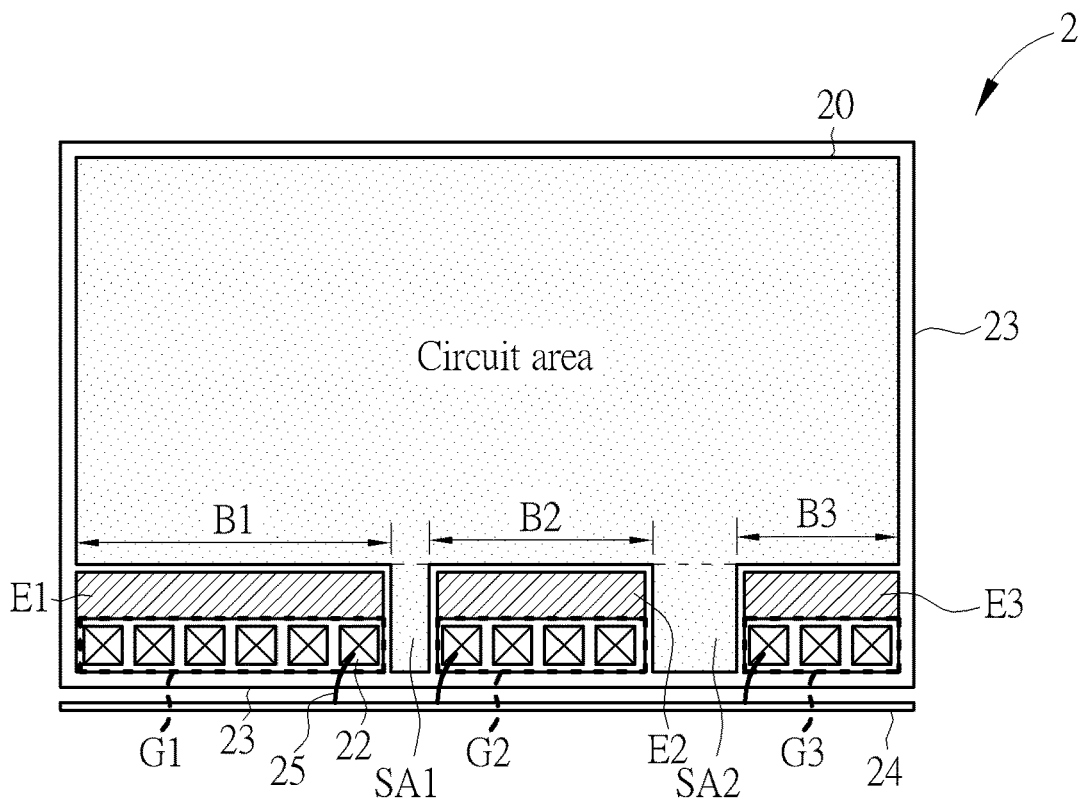
FIG. 2 is a schematic diagram of an integrated circuit ESD bus structure according to an embodiment of the present invention.

FIG. 2 is a schematic diagram of an integrated circuit electrostatic discharge (ESD) structure 2 according to an embodiment of the present invention. The integrated circuit ESD bus structure 2 includes a circuit area 20, a plurality of ESD buses E1, E2 and E3, a plurality of pad groups G1, G2 and G3, a common ESD bus 24, and a plurality of bonding wires 25.

The circuit area 20 is formed by a plurality of chip edges 23; for example, the four chip edges 23 forms a rectangular area configured to contain the circuit area 20. The circuit area 20 includes a plurality of discontinuous boundaries B1, B2 and B3. The plurality of ESD buses E1, E2 and E3 is formed inside the chip edges 23, corresponding and adjacent to the plurality of discontinuous boundaries B1, B2, and B3.

The plurality of pad groups G1, G2 and G3 is formed inside the chip edges 23, adjacent and connected to the plurality of ESD buses E1, E2 and E3. The common ESD bus 24 is formed outside the chip edges 23, which is not limited. The common ESD bus 24 may not be formed in one piece, and include a plurality of discontinuous ESD bus groups. The plurality of bonding wires 25 is formed across the chip edges 23, and configured to connect the plurality of pad groups B1, B2 and B3 to the common ESD bus 24. In one embodiment, the common ESD bus 24 is parallel to the plurality of ESD buses E1, E2 and E3 and the plurality of pad groups G1, G2 and G3.

Each of the plurality of pad groups G1, G2 and G3 includes at least one pad 22, wherein the pad 22 is an input/output pad connected to a ground or a system low voltage. At least one of the plurality of bonding wires 25 is configured to connect the at least one pad 22 to the common ESD bus 24. In one embodiment, multiple bonding wires 25 may be configured to connect multiple pads 22 of the pad group G1 to the common ESD bus 24, which provides multiple connections to enhance conductivity between the pad group G1 and the common ESD bus 24 to improve ESD protection.

In such a structure, the discontinuous ESD buses E1, E2 and E3 may be connected together by connecting the pads 22 of the pad groups G1, G2 and G3 to the common ESD bus 24 through the bonding wires 25, which equivalently forms a continuous ESD bus for the integrated circuit ESD bus structure 2. As a result, the present invention may get rid of the filler cells of the prior art. In addition, spaces between the discontinuous ESD buses E1 and E2 (or, E2 and E3) may be configured with circuit elements to make full use of the integrated circuit ESD bus structure 2.

Figure 1:
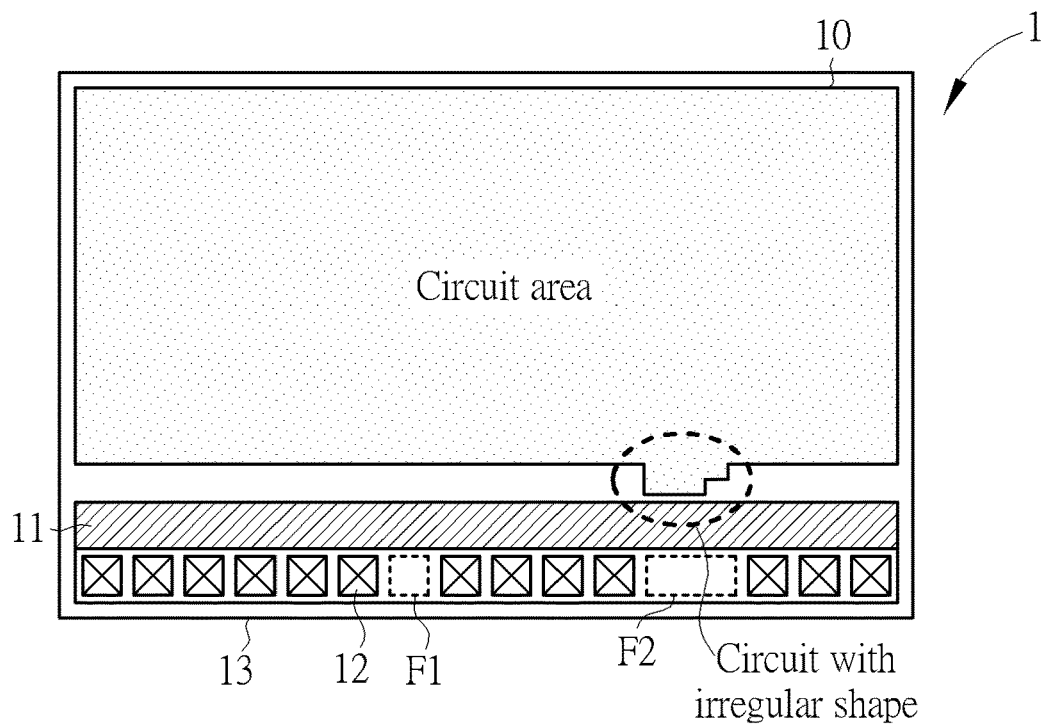
FIG. 1 is a schematic diagram of an integrated circuit ESD bus structure according to the prior art.

For example, the ESD bus 11 and the filler cells F1 and F2 shown in FIG. 1 are replaced by saved areas SA1 and SA2 in FIG. 2. The saved area SA1 is adjacent to the ESD buses E1 and E2 and the pads 22 of the pad groups G1 and G2. The saved area SA2 is adjacent to the ESD buses E2 and E3 and the pads 22 of the pad groups G2 and G3. In one embodiment, the common ESD bus 24 is formed inside the chip edges 23, and adjacent to the plurality of pad groups G1, G2 and G3 and the saved areas SA1 and SA2.

Figure 3:
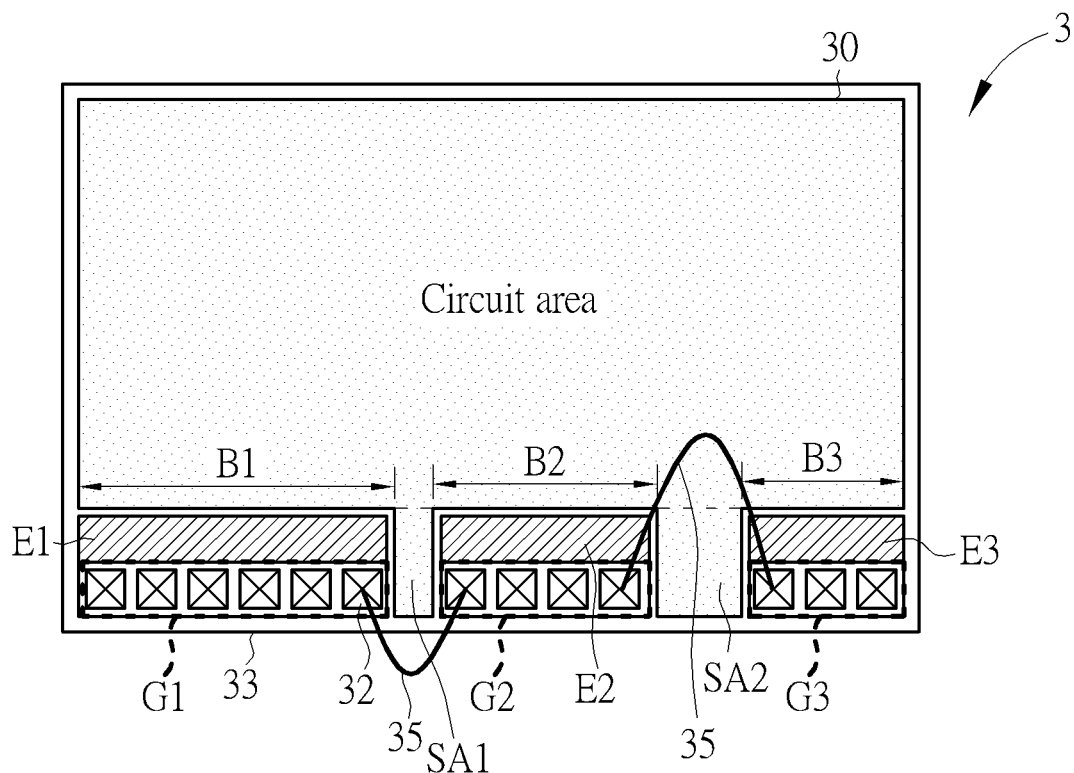
FIG. 3 is a schematic diagram of an integrated circuit ESD bus structure according to an embodiment of the present invention.

FIG. 3 is a schematic diagram of an integrated circuit ESD bus structure 3 according to an embodiment of the present invention. The integrated circuit ESD bus structure 3 includes a circuit area 30, a plurality of ESD buses E1, E2 and E3, a plurality of pad groups G1, G2 and G3, and a plurality of bonding wires 35.

The circuit area 30 is formed by a plurality of chip edges 33; for example, the four chip edges 33 forma rectangular area to contain the circuit area 30. The circuit area 30 includes a plurality of discontinuous boundaries B1, B2 and B3. The plurality of ESD buses E1, E2 and E3 is formed inside the chip edges 33, corresponding and adjacent to the plurality of discontinuous boundaries B1, B2, and B3.

The plurality of discontinuous ESD buses E1, E2 and E3 is formed inside the chip edges 33, and adjacent to the plurality of discontinuous boundaries B1, B2, and B3. The plurality of pad groups G1, G2, and G3 is formed inside the chip edges 33, adjacent and connected to the plurality of ESD buses E1, E2 and E3. The plurality of bonding wires 35 is formed across the circuit area 30, and configured to connect the plurality of pad groups G1, G2, and G3 from one group to another group, e.g., one bonding wire 35 may connect the pad group G1 to the pad group G2, and another bonding wire 35 may connect the pad group G2 to the pad group G3.

Each of the plurality of pad groups G1, G2 and G3 includes a plurality of pads 32, wherein the pad 32 is an input/output pad connected to a ground or a system low voltage. The plurality of bonding wires 35 is configured to connect the pads 32 of one group to another group. Each of the plurality of pad groups G1, G2 and G3 comprises a connecting pad (e.g., a right most pad of the pad group G1, left and right most pads of the pad group G2, and a left most pad of the pad group G3), and the plurality of bonding wires 35 are configured to connect the connecting pad of one of the plurality of pad groups to the connecting pad of another of the plurality of pad groups. For example, one of the bonding wires 35 is configured to connect the right most pad 32 of the pad group G1 to the left most pad 32 of the pad group G2, and one of the bonding wires 35 is configured to connect the right most pad 32 of the pad group G2 to the left most pad 32 of the pad group G3, which is not limited.

In such a structure, the discontinuous ESD buses E1, E2 and E3 may be connected together by connecting the pads 32 of the pad groups G1, G2 and G3 from one group to another group, which equivalently forms a continuous ESD bus for the integrated circuit ESD bus structure 3. As a result, the present invention may get rid of the filler cells of the prior art. In addition, spaces between the discontinuous ESD buses E1 and E2 (or, E2 and E3) may be configured with circuit elements to make full use of the integrated circuit ESD bus structure 3. For example, the ESD bus 11 and the filler cells F1 and F2 shown in FIG. 1 are replaced by saved areas SA1 and SA2 in FIG. 2, and thus the circuit area 20 may contain the circuits with irregular shapes and different areas without increasing its area, which saves production cost.

Figure 4:
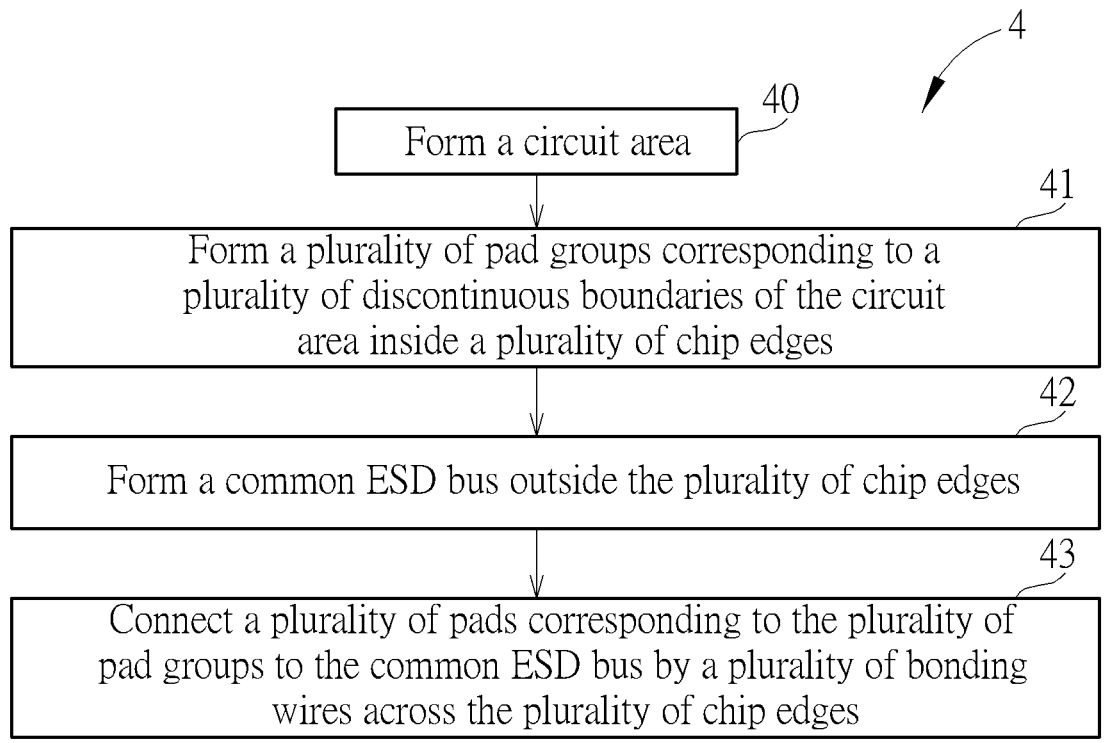
FIG. 4 is a flowchart of an integrated circuit packaging process according to an embodiment of the present invention.

FIG. 4 is a flowchart of an integrated circuit ESD bus structure process 4 according to an embodiment of the present invention.

Step 40: Form a circuit area.

Step 41: Form a plurality of pad groups corresponding to a plurality of discontinuous boundaries of the circuit area inside a plurality of chip edges.

Step 42: Form a common ESD bus outside the plurality of chip edges.

Step 43: Connect a plurality of pads corresponding to the plurality of pad groups to the common ESD bus by a plurality of bonding wires across the plurality of chip edges.

In Step 40, a circuit area is formed; in step 41, a plurality of pad groups corresponding to a plurality of discontinuous boundaries of a circuit area inside a plurality of chip edges is formed; in step 42, a common ESD bus outside the plurality of chip edges is formed; and in step 43, a plurality of pads corresponding to the plurality of pad groups is connected to the common ESD bus by a plurality of bonding wires across the plurality of chip edges. By the integrated circuit ESD bus structure process 4, a continuous ESD bus may be equivalently formed and the filler cells of the prior art may be omitted.

Figure 5:
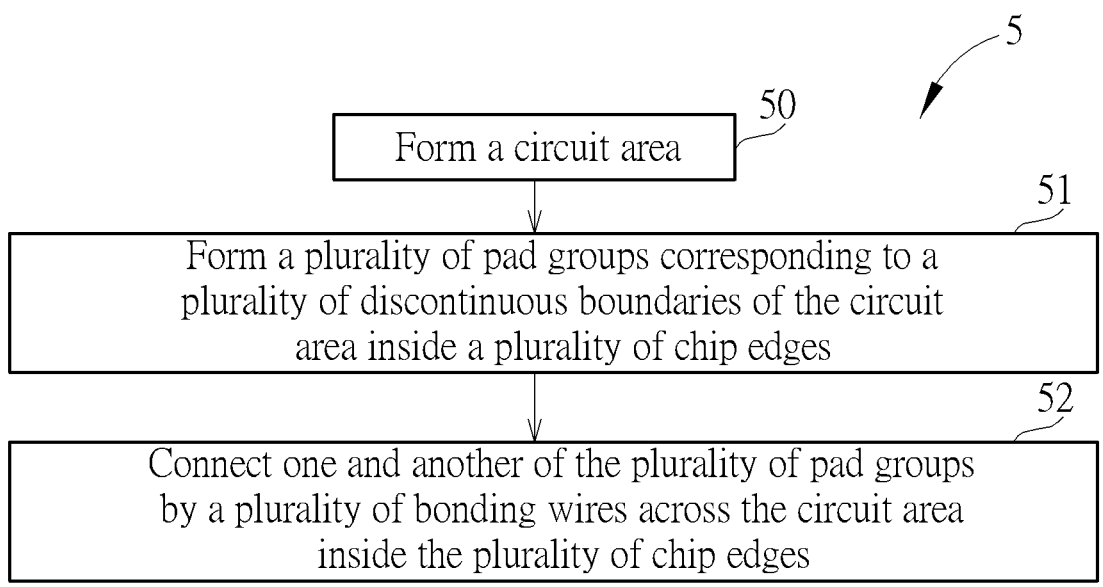
FIG. 5 is a flowchart of an integrated circuit packaging process according to an embodiment of the present invention.

FIG. 5 is a flowchart of an integrated circuit ESD bus structure process 5 according to an embodiment of the present invention.

Step 50: Form a circuit area.

Step 51: Form a plurality of pad groups corresponding to a plurality of discontinuous boundaries of the circuit area inside a plurality of chip edges.

Step 52: Connect one and another of the plurality of pad groups by a plurality of bonding wires across the circuit area inside the plurality of chip edges.

In Step 50, a circuit area is formed; in step 51, a plurality of pad groups corresponding to a plurality of discontinuous boundaries of a circuit area inside a plurality of chip edges is formed; and in step 52, one and another of the plurality of pad groups are connected together by a plurality of bonding wires across the circuit area inside the plurality of chip edges. By the integrated circuit ESD bus structure process 5, a continuous ESD bus may be equivalently formed and the filler cells of the prior art may be omitted.

To sum up, the present invention utilizes bonding wires to connect a plurality of pads of a plurality of pad groups, so as to equivalently form a continuous ESD bus. As a result, the present invention may get rid of the filler cells of the prior art. In addition, spaces between the discontinuous ESD buses may be configured with circuit elements to make full use of the integrated circuit ESD bus structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit structure, comprising:
   a circuit area;
   a plurality of ESD buses;
   a plurality of pad groups, adjacent and connected to the plurality of ESD buses;
   a common ESD bus, adjacent to the plurality of pad groups; and
   a plurality of bonding wires configured to connect the plurality of pad groups to the common ESD bus;
   wherein the circuit area comprises at least one saved area, each of at least one saved area is adjacent to two respective ESD buses of the plurality of ESD buses and respective pads of two respective pad groups of the plurality of pad groups, and there is no ESD bus and no pad in the at least one saved area.

2. The integrated circuit structure of claim 1, wherein each of the plurality of pad groups comprises at least one pad, and the plurality of bonding wires is configured to connect the at least one pad to the common ESD bus.

3. The integrated circuit structure of claim 1, wherein common ESD bus comprises a plurality discontinuous ESD bus groups.

4. The integrated circuit structure of claim 1, wherein the common ESD bus is formed outside the plurality of chip edges or inside the plurality of chip edges.

5. The integrated circuit structure of claim 1, wherein the common ESD bus is parallel to the plurality of ESD buses.

6. An integrated circuit structure, comprising:
   a circuit area;
   a plurality of ESD buses;
   a plurality of pad groups, adjacent and connected to the plurality of ESD buses; and
   a plurality of bonding wires configured to connect one to another of the plurality of pad groups;
   wherein the circuit area comprises at least one saved area, each of at least one saved area is adjacent to two respective ESD buses of the plurality of ESD buses and respective pads of two respective pad groups of the plurality of pad groups, and there is no ESD bus and no pad in the at least one saved area.

7. The integrated circuit structure of claim 6, wherein each of the plurality of pad groups comprises a connecting pad, and the plurality of bonding wires are configured to connect the connecting pad of one of the plurality of pad groups to the connecting pad of another of the plurality of pad groups.

8. A method of integrated circuit structure, comprising:
   forming a circuit area;
   forming a plurality of ESD buses;
   forming a plurality of pad groups corresponding to a plurality of discontinuous boundaries of the circuit area, wherein the plurality of pad groups are adjacent and connected to the plurality of ESD buses;
   forming a common ESD bus adjacent to the plurality of pad groups; and
   connecting a plurality of pads corresponding to the plurality of pad groups to the common ESD bus by a plurality of bonding wires;
   wherein the circuit area comprises at least one saved area, each of at least one saved area is adjacent to two respective ESD buses of the plurality of ESD buses and respective pads of two respective pad groups of the plurality of pad groups, and there is no ESD bus and no pad in the at least one saved area.

9. The method of integrated circuit structure of claim 8, wherein each of the plurality of pad groups comprises at least one pad, and the plurality of bonding wires is configured to connect the at least one pad to the common ESD bus.

10. The method of integrated circuit structure of claim 8, further comprising:
    forming the common ESD bus outside the plurality of chip edges or inside the plurality of chip edges.

11. The method of integrated circuit structure of claim 8, wherein the common ESD bus is parallel to the plurality of ESD buses.

12. A method of integrated circuit structure, comprising:
    forming a circuit area;
    forming a plurality of ESD buses;
    forming a plurality of pad groups corresponding to a plurality of discontinuous boundaries of the circuit area, wherein the plurality of pad groups are adjacent and connected to the plurality of ESD buses; and
    connecting one of the plurality of pad groups to another of the plurality of pad groups by one of a plurality of bonding wires across the circuit area;
    wherein the circuit area comprises at least one saved area, each of at least one saved area is adjacent to two respective ESD buses of the plurality of ESD buses and respective pads of two respective pad groups of the plurality of pad groups, and there is no ESD bus and no pad in the at least one saved area.

13. The method of integrated circuit structure of claim 12, wherein a common ESD bus is parallel to the plurality of ESD buses and the plurality of pad groups.

14. The method of integrated circuit structure of claim 12, wherein each of the plurality of pad groups comprises a connecting pad, and the plurality of bonding wires are configured to connect the connecting pad of one of the plurality of pad groups to the connecting pad of another of the plurality of pad groups.

* * * * *